United States Patent [19]

Moreland

[11] Patent Number: 5,539,338
[45] Date of Patent: Jul. 23, 1996

[54] INPUT OR OUTPUT SELECTABLE CIRCUIT PIN

[75] Inventor: Carl W. Moreland, Greensboro, N.C.

[73] Assignee: Analog Devices, Inc., Norwood, Mass.

[21] Appl. No.: 348,052

[22] Filed: Dec. 1, 1994

[51] Int. Cl.6 .................................................. H03K 5/19
[52] U.S. Cl. ............................... 327/19; 327/99; 327/407
[58] Field of Search ................................ 327/19, 99, 407, 327/534, 546, 535, 536, 541, 20, 78

[56] References Cited

U.S. PATENT DOCUMENTS

| | | | |
|---|---|---|---|
| 4,683,382 | 7/1987 | Sakurai et al. ........................... | 327/541 |
| 4,928,056 | 5/1990 | Pease ....................................... | 327/535 |
| 4,950,921 | 8/1990 | Takada ..................................... | 327/541 |
| 5,034,625 | 7/1991 | Min et al. ................................ | 327/536 |
| 5,075,569 | 12/1991 | Branson ................................... | 327/407 |
| 5,247,209 | 9/1993 | Cheng ..................................... | 327/546 |
| 5,396,114 | 3/1995 | Lee et al. ................................. | 327/535 |

*Primary Examiner*—Timothy P. Callahan
*Assistant Examiner*—My-Trang Nu Ton
*Attorney, Agent, or Firm*—Hale and Dorr

[57] ABSTRACT

A circuit for selecting between two states and using the same pin as an input and an output. On power-up, the pin can be connected to either a grounded resistor (to select the first state) or the power supply (to select the second state). The input signal generates a logic select signal. The logic select signal selects between first and second logic formats. If the first format is selected, the pin is used to output a reference voltage for that format. If the second format is selected, the logic select signal also provides a disable signal, that prevents the reference voltage output from appearing on the pin.

20 Claims, 1 Drawing Sheet

5,539,338

INPUT OR OUTPUT SELECTABLE CIRCUIT PIN

FIELD OF THE INVENTION

This invention relates to circuits for reducing the pin-count of an integrated circuit chip. More particularly, the present invention relates to pins of an integrated circuit chip that may be used as an input to perform selection functions and as an output.

BACKGROUND OF THE INVENTION

In any modern day circuit design, it is desirable to minimize the use of circuit pins for getting signals on and off an integrated circuit ("IC") chip. A first way of doing this was to change some pins from dedicated input or output pins to pins which could be used for input and output, which are commonly referred to as I/O pins. These were used mostly for the transfer of data on and off an IC chip but were not used particularly as function pins. Function pins were still primarily dedicated pins. Therefore, for pin conservation it is desirable to be able to use an I/O pin also as a function pin. In particular, it is desirable to be able to use an I/O pin for functions such as the selection of a digital electronic format for a selectable logic output stage or other desired functions.

In accomplishing such tasks for an I/O pin, consideration must be taken for problems that will necessarily arise. For instance, there must be a way of preventing the multiple tasks from interfering. Also, the circuits for permitting the I/O pin to perform the multiple function must use minimal IC chip space. The present invention overcomes these problems and provides I/O pins that also are used as function pins which can sense the logic format level selected so as to connect the selected output and disable all others. This selection usually is performed at the IC chip's power-up.

SUMMARY OF THE INVENTION

The present invention is directed to I/O pins that may be used as selectable circuit pins, for selecting output logic formats.

According to the invention, an I/O pin will perform a selection function at power-up depending on how the pin is connected exteral to the chip. The I/O pin is connected internally to circuitry that is used on power-up to select one of two operating states, and then becomes an output pin that outputs a reference voltage.

In the internal circuitry the select signal is the input to a latch, which is activated by a delayed clock signal. Preferably, that clock signal is generated by a ramp generator. As a result of the delay, the select signal is not latched until after the IC chip is powered up.

The output of the latch is the internal logic select signal for selecting one of the logic formats available. In addition, the output of the latch and the clock signal also are input to an AND gate. The output of the AND gate is used for enabling an output stage with a particular output signal. If, however, the output of the latch is of an opposite state, the output of the AND gate will disable the output signal.

In a second embodiment of the present invention, the select signal is input to a comparator. The second input to the comparator is a reference voltage. If the select signal is at one predetermined level, the output of the comparator will enable a first predetermined logic format. The output of the comparator will enable a different format if the select signal is at a different predetermined level. The output of the comparator also is used to enable or disable an output signal of the output stage.

It is therefore an object of the present invention to reduce the number of pins on a chip.

It is another object of the present invention to permit a single pin to be used both as an input to perform an initial selection function and as an output.

DETAILED DESCRIPTION OF THE INVENTION

Figure 1:
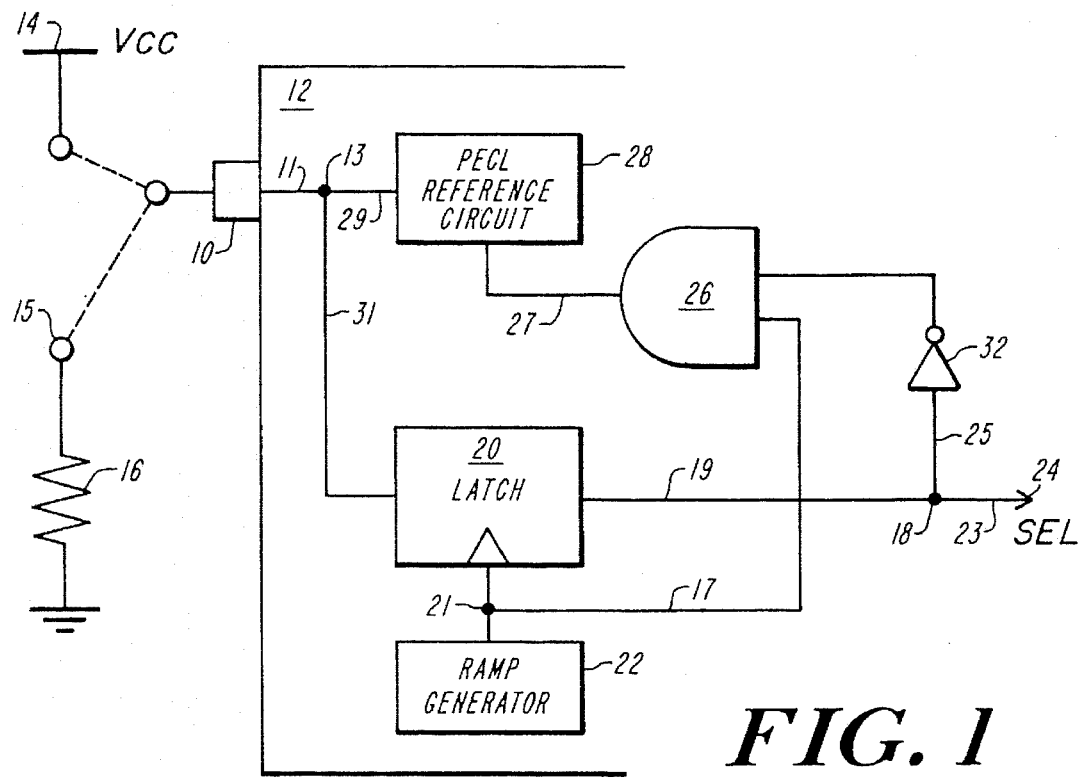
FIG. 1 is a partial block, partial schematic circuit diagram of one embodiment of the present invention.

The present invention is directed to I/O pins that may be used as selectable circuit pins for selecting logic formats for output signals. A first embodiment of the present invention is illustrated in FIG. 1. At the time of IC chip power-up, the user decides the logic format he or she desires for output signals, such as CMOS or PECL. Although, these formats are mentioned, it is within the scope of the present invention that more than these two logic formats could be available for selection. In FIG. 1, the user would connect I/O pin 10 of IC chip 12 to, for example, either power supply $V_{CC}$ 14 or node 15 that connects to standard PECL load resistor 16. When I/O pin 10 is connected to $V_{CC}$ 14 or to node 15, it is being used for selecting either CMOS or PECL for the output logic format.

After the IC chip is started up, ramp generator 22 provides a time-delayed latch signal to cause latch 20 to latch the input signal on I/O pin 10. I/O pin 10 connects to latch 20 via line 11, node 13, and line 31.

The output of latch 20 on line 19 serves as a logic select signal for selecting, for example, either a CMOS or PECL logic format. If the output of latch 20 is HIGH, to indicate that I/O pin 10 was connected to $V_{CC}$ 14, CMOS is selected and PECL reference circuit 28 will remain disabled. If the output of latch 20 is LOW to indicate that I/O pin 10 is connected to PECL node 15, PECL is selected and PECL reference circuit 28 will be enabled as will be shown.

The output of latch 20 on line 19 connects to node 18. Line 25 connects node 18 to the input of inverter 32, which connects to one input to AND gate 26. The second input to AND gate 26 is the latch signal on line 17. AND gate 26 provides an enable signal for PECL reference circuit 28 via line 27. When PECL reference circuit 28 is enabled, it outputs a PECL reference voltage, 1.4 volts below $V_{CC}$ 14, which is available at I/O pin 10. The output of PECL reference circuit 28 connects to I/O pin 10 via line 29, node 13, and line 11.

Initially, AND gate 26 receives an unknown signal from latch 20 and a LOW signal from ramp generator 22. Consequently, the output of AND gate 26 is LOW, and PECL reference circuit 28 is disabled. This allows I/O pin 10 to serve as an input for performing the logic select function.

Until ramp generator 22 provides the latch signal to latch 20, AND gate 26 receives a LOW signal from ramp generator 22, and PECL reference circuit 28 continues to be disabled. This keeps the PECL reference circuit disabled until the circuit has powered up completely.

Once the latch signal causes latch 20 to latch the signal on I/O pin 10, the latch signal will be a HIGH signal. If I/O pin 10 was connected to node 15, the output of latch 20 is a logic LOW signal and the output of inverter 32 is a logic HIGH signal. When both of the inputs to AND gate 16 are logic HIGH signals, the output of the gate is a logic HIGH signal. This will enable PECL reference circuit 28. As such, the output of PECL reference unit 28 on line 29 that connects to node 13 is a signal that is 1.4 volts below $V_{CC}$ 14. On the other hand, if I/O pin 10 had been connected to power supply 14, latch 20 will produce a logic HIGH signal at its output. This will cause a logic LOW signal to be output from AND gate 26 (because the output of inverter 32 will be a logic LOW signal), disabling PECL reference circuit 28.

Figure 2:
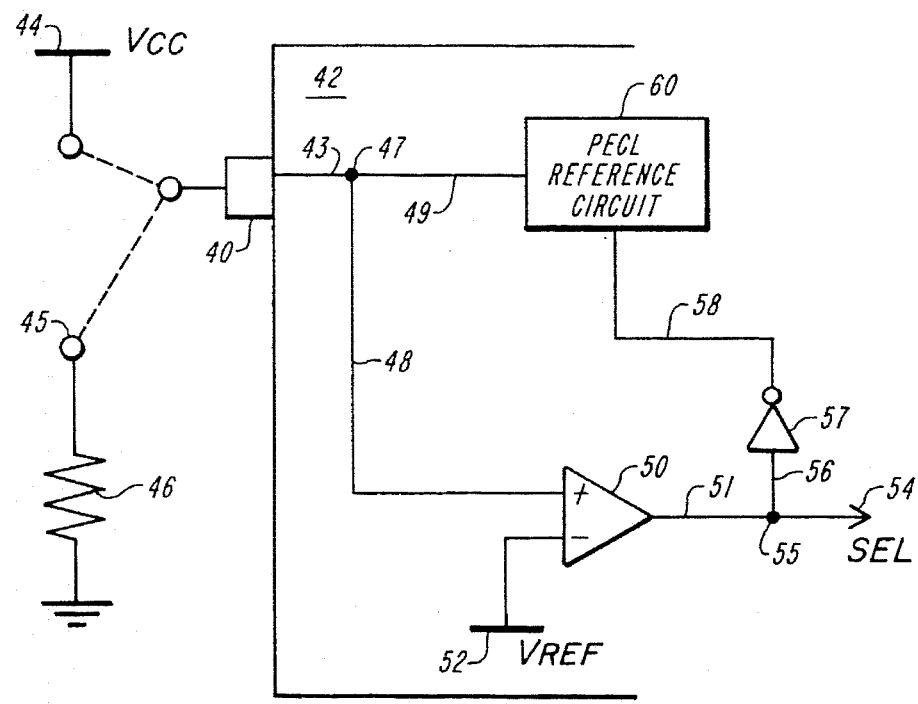
FIG. 2 is a partial block, partial schematic circuit diagram of a second embodiment of the present invention.

A second embodiment of the I/O pin circuit of the present invention is shown in FIG. 2. When powering-up IC chip 42, I/O pin 40 can be connected to either the power supply $V_{CC}$ 44 or to node 45 that connects to standard PECL load resistor 46. I/O pin 40 connects to node 47 via line 43. Line 48 connects node 47 to the noninverting input of comparator 50. The second input to comparator 50 is connected to $VRE_F$ 52. $V_{REF}$ 52 is set to a level below $V_{CC}$ 44 but above the PECL reference voltage level.

When the signal on I/O pin 40 is a logic HIGH level to indicate it is connected to $V_{CC}$ 44, the output of comparator 50 on line 51 is a logic HIGH signal. This is input to node 55 and line 54. The HIGH signal on line 54 selects CMOS logic. When the signal on I/O pin 40 is a logic LOW signal to indicate that I/O pin 40 is connected to PECL load resistor 46, the output of comparator 50 is a logic LOW signal. The resulting LOW signal on line 54 selects PECL.

Line 56 connects node 55 to the input of inverter 57. The output of inverter 57, on line 58, provides an enable signal to PECL reference circuit 60. When the signal on line 56 is a logic HIGH signal (CMOS selected), the enable signal on line 58 is a logic LOW signal, and PECL reference circuit 60 is disabled. However, when the signal on line 56 is a logic LOW signal (PECL selected), the enable signal on line 58 is a logic HIGH signal, and PECL reference circuit 60 is enabled and a voltage 1.4 volts below $V_{CC}$ is available at I/O pin 40. PECL reference circuit 60 connects to I/O pin 40 via line 49, node 47, and line 43. In addition, the output of PECL reference circuit 60 is fed back to comparator 50, which keeps the output of comparator 50 at a logic LOW signal. This keeps PECL reference circuit 60 enabled, and select line 54 selecting PECL.

While there have been shown and described examples of the present invention, it will be readily apparent to those skilled in the art that various changes and modifications may be made therein without departing from the scope of the invention as defined by the appended claims. Accordingly, the invention is limited only by the following claims and equivalents thereto.

I claim:

1. A selector circuit for use with an integrated circuit input/output ("I/O") pin for selecting from among a plurality of states by connecting one of a voltage level and a load to the I/O pin, the circuit comprising:

a latch, connected to the I/O pin, for receiving a signal at the I/O pin and for providing a latched output signal that indicates a selected state;

means for generating a time-delayed latch signal, with an output of the generating means being connected to the latch for providing the latch signal to the latch;

logic circuitry having a first input, a second input, and an output, the first input being connected to receive the latched output signal, the second input connected to the output of the generating means, and the output providing an enabling signal; and an output circuit for receiving the enabling signal and for providing an output signal to the I/O pin when enabled, the output circuit being enabled in response to the load being connected to the I/O pin, but not in response to all signals received at the I/O pin.

2. The circuit as in claim 1, wherein the generating means includes a ramp generator.

3. The circuit as in claim 1, wherein a first of the plurality of states corresponds to a logic format for use with positive emitter coupled logic ("PECL") circuitry.

4. The circuit as in claim 3, wherein the output circuit generates a PECL reference voltage.

5. The circuit as in claim 3, wherein a second of the plurality of states corresponding to a logic format for use with complementary metal oxide semiconductor ("CMOS") circuitry.

6. A selector circuit for use with an I/O pin for selecting from among at least first and second states by connecting one of a voltage level and a load to the I/O pin, the first and second states for use with reference voltages having one of a first and second voltage level, respectively, the circuit comprising:

a comparator having a first input, a second input, and an output, the first input being coupled to the I/O pin;

an output circuit enabled to provide an output voltage to the I/O pin when a first input signal is received by the comparator indicating that a first state is selected, the output circuit being responsive to a signal at the output of the comparator; and a reference voltage connected to the second input of the comparator and having a voltage level between the first voltage level corresponding to the first state and the second voltage level corresponding to the second state.

7. The circuit as in claim 6, wherein the first state corresponds to a logic format for use with positive emitter coupled logic (PECL) circuitry.

8. The circuit as in claim 7, wherein the output generates a PECL reference voltage.

9. The circuit as in claim 7, wherein the second state corresponds to a logic format for use with complementary metal oxide semiconductor ("CMOS") circuitry.

10. The circuit as in claim 9, wherein the first input of the comparator is the non-inverting input of the comparator and the second input of the comparator is the inverting input of the comparator.

11. The circuit as in claim 7, wherein the first input of the comparator is the non-inverting input of the comparator and the second input of the comparator is the inverting input of the comparator.

12. A circuit for use with an I/O pin comprising:

an input circuit coupled to the I/O pin for connection to one of a voltage level and a load corresponding to a respective first and second state, the input circuit for providing a selection signal identifying the state indicated by the connection to the I/O pin;

a logic circuit, coupled to receive the selection signal, for providing an enabling signal; and an output circuit, responsive to the enabling signal and coupled to the I/O pin, for providing an output voltage through the I/O pin when the I/O pin is connected to the load, and not being provided when the I/O pin is connected to the voltage level, the I/O pin thereby being used both to receive the input signal and to selectively provide an output voltage.

13. The circuit of claim 12, wherein the input circuit, the logic circuit, and the output circuit have sufficient delay so that the input signal is received at power-up of the circuitry and the output voltage is applied after the selection signal is provided.

14. The circuit of claim 12, wherein the input circuit includes a latch and a latch signal generator coupled to the latch and to the logic circuit, wherein, prior to power-up, the logic circuit provides an enabling signal that prevents the output signal from providing the output voltage.

15. The circuit of claim 12, wherein the input circuit includes a comparator for comparing the input signal and a reference signal wherein, prior to power-up, the logic circuit provides an enabling signal that prevents the output signal from providing the output voltage.

16. The circuit of claim 12, wherein the first and second states are logic formats used with respective first and second voltage supplies, wherein the reference signal is a voltage between the values of the first and second voltage supplies.

17. The circuit of claim 16, wherein at least some of the logic formats are selected from a group consisting of TTL, PECL, and CMOC logic.

18. A method for use with an I/O pin, the method comprising the circuit-implemented steps of:

(a) providing a path to the I/O pin from one of a voltage level and a load, each corresponding to one of a plurality of respective logic formats;

(b) providing a selection signal indicating the logic format in response to a signal received in step (a); and (c) providing a reference voltage as an output through the I/O pin in response to at least one but not all values of the selection signal.

19. The method of claim 18, wherein step (b) includes comparing the input signal to a reference voltage.

20. The method of claim 18, wherein step (b) includes latching the input signal in response to a latch signal from a generator.

* * * * *